United States Patent
Yang et al.

[19]
[11] Patent Number: 5,962,899
[45] Date of Patent: *Oct. 5, 1999

[54] ELECTROSTATIC DISCHARGE PROTECTION CIRCUIT

[75] Inventors: Hyang-Ja Yang; Hee-Chul Park, both of Suwon, Rep. of Korea

[73] Assignee: Samsung Electronics, Co., Ltd., Suwon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/628,388

[22] Filed: Apr. 5, 1996

[30] Foreign Application Priority Data

Apr. 6, 1995 [KR] Rep. of Korea ............... 1995-7970

[51] Int. Cl.[6] .................. H01L 23/60; H01L 27/092
[52] U.S. Cl. ........................... 257/360; 257/369
[58] Field of Search ................... 257/357, 360, 257/369

[56] References Cited

U.S. PATENT DOCUMENTS

| | | | |
|---|---|---|---|
| 4,132,904 | 1/1979 | Harari | 257/369 |
| 4,509,067 | 4/1985 | Minami et al. | 257/360 |
| 4,616,243 | 10/1986 | Minato et al. | 257/357 |
| 4,688,065 | 8/1987 | Kinoshiba et al. | 257/360 |
| 4,780,753 | 10/1988 | Ohkura et al. | 257/369 |
| 5,182,621 | 1/1993 | Hinooka | 257/369 |
| 5,449,940 | 9/1995 | Hirata | 257/360 |

*Primary Examiner*—Gene M. Munson
*Attorney, Agent, or Firm*—Marger Johnson & McCollom, P.C.

[57] ABSTRACT

A semiconductor memory device conserves chip area by jointly connecting transistors which are respectively connected to pads adjacent to each other. The device includes first and second electrostatic discharge protection MOSFET transistors which have drains respectively connected to pads adjacent to each other and which define a first active area. A common source is arranged between the first and second transistors areas and defines a second active area in common to both transistors. The device is connected to a single power supply at the gates and sources thereof. The transistors also share common active ground lines.

12 Claims, 10 Drawing Sheets

ELECTROSTATIC DISCHARGE PROTECTION CIRCUIT

BACKGROUND OF THE INVENTION

1. Field of the Invention

The present invention relates to a semiconductor memory and more particularly to a semiconductor memory device having a pad layout which consumes less chip area by jointly connecting transistors that are respectively connected to pads adjacent to each other.

The present application claims priority from Korean Application No. 7970/1995 which is incorporated herein by reference for all purposes.

2. Description of the Related Art

Techniques for achieving high speed, high integration and low product cost of semiconductor memory devices is a continuing objective of the semiconductor memory industry. Miniaturization of semiconductor memory devices to achieve lower product cost has therefore become a key concern to manufacturers. However, since the number of pins increases as the capacity of a memory chip increases, a conventional pad layout necessarily increases die size.

Referring now to FIG. 1 showing a layout of an electrostatic discharge ESD protection transistor connected to a conventional address pad, it can be seen that ESD protection transistors 1 and 2 are respectively connected to address pads 9 and 10. The ESD protection transistor 1 has N-type active areas 3 and 4, which are formed to be separated from each other at a given interval T1 in a vertical direction. Source areas S1, S2, S3, S4 are formed in the N-type active areas 3 and 4. Drain areas D1 and D2 are respectively formed between the source areas S1 and S2 and areas S3 and S4. A gate G1 is formed on a channel area formed between the drain areas D1 and D2 and between the source areas S1 to S4. To instantaneously discharge a large amount of current in case a high voltage is applied through the drain areas D1 and D2 connected to the address pad 9, gate G1 has a wide width. In order to achieve better efficiency, active areas 3 and 4 are separated from each other at the given interval T1. Drain areas D1 and D2 and source areas S1 to S4 are areas into which N-type impurity ions of high density are injected. Gate G1 is symmetrically formed centering on drain areas D1 and D2.

The ESD protection transistor 2 is formed in the same manner as the ESD protection transistor 1 and includes a gate G2. The ESD protection transistor 1 is shielded by a P-type active guard line 5 for preventing latch up. The P-type active guard line 5 is then shielded by a N-type active guard line 6. Similarly, the ESD protection transistor 2 is shielded by a P-type active guard line 7. The P-type active guard line 7 is then shielded by a N-type active guard line 8. As described above, each of ESD protection transistors 1 and 2 is shielded by the corresponding P-type active guard lines 5,8, and has an N-type active area which includes a source area for each transistor. There is a disadvantage with this arrangement in that a large part of the area between the pads, like pads 9,6, is occupied by ESD

SUMMARY OF THE INVENTION

It is an object of the present invention to provide a semiconductor memory device having a pad layout which reduces die size.

It is another object of the present invention to provide a semiconductor memory device having a pad layout which reduces die size by providing active guard lines as well as N-type active areas which are shared by electrostatic discharge protection transistors adjacent to each other.

To achieve these and other objects according to one aspect of the present invention, an electrostatic discharge protection circuit for a semiconductor memory device having a plurality of pads includes a first transistor comprising a first terminal defining a first active area. The first terminal is connected to a first one of such pads. A first channel area is formed adjacent the first active area and a second terminal is arranged adjacent the first channel area.

A second transistor comprises a first terminal having a first active area. The first terminal of the second transistor is connected to a second one of such pads adjacent the first pad. A second channel area is formed adjacent the first active area in the second transistor and a second terminal is arranged adjacent the second channel area.

A third terminal is common to the first and second transistors and defines a second active area. The third terminal is arranged between the first and second channel areas. The second terminals and the common third terminal are connected to a common potential.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
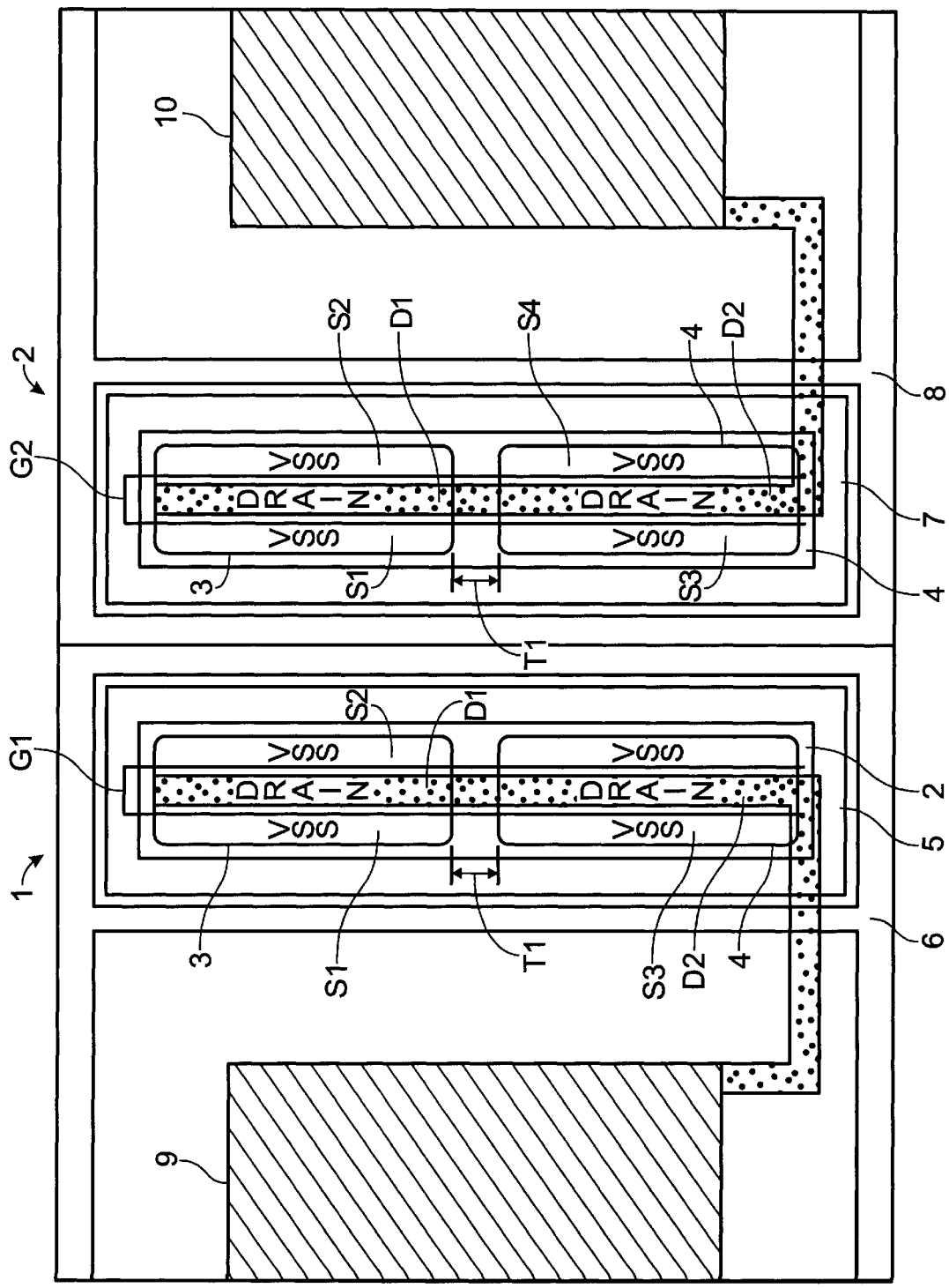
FIG. 1 is a view illustrating a layout of a prior art ESD circuit and associated address pad.
Figure 2:
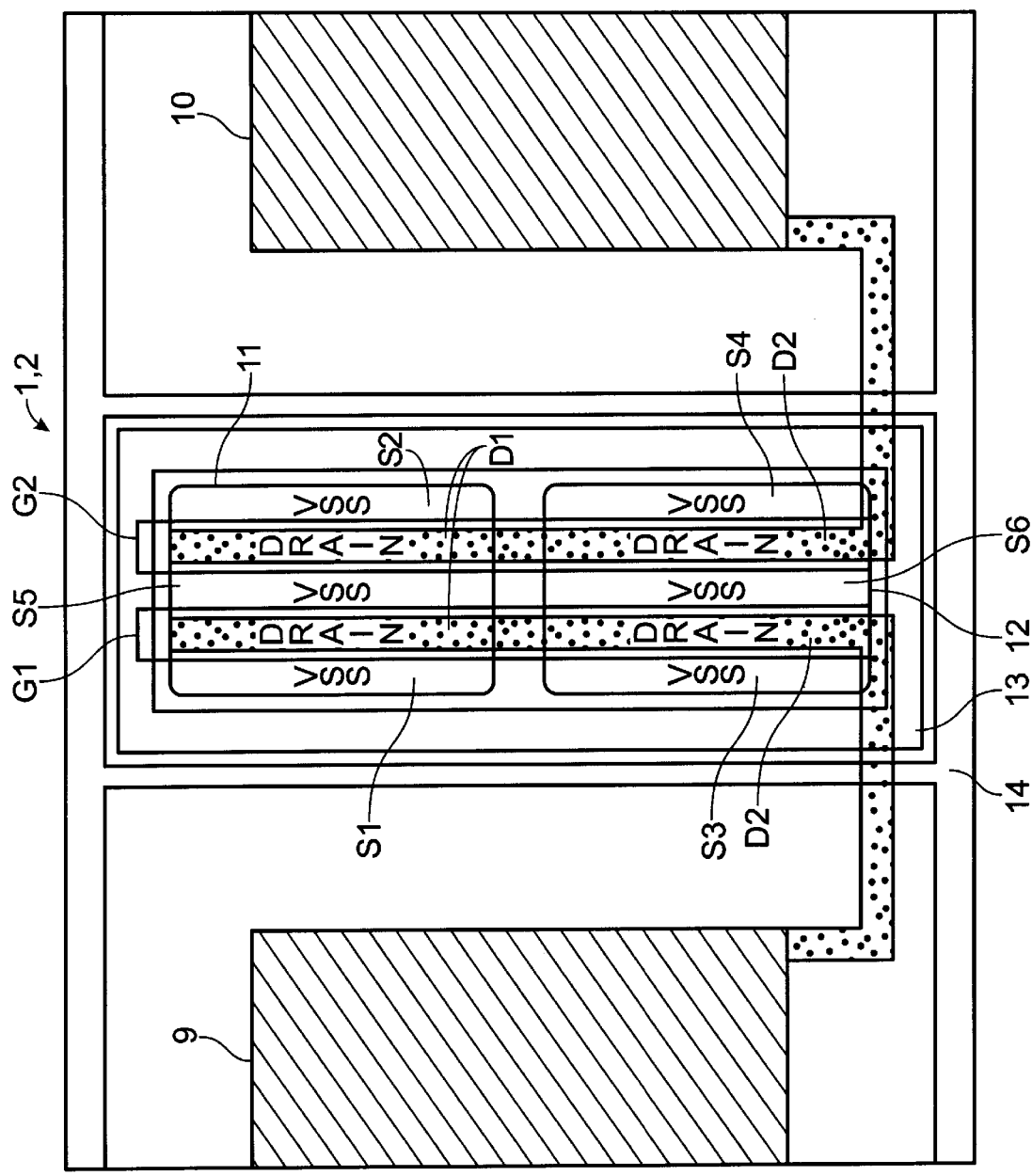
FIG. 2 is a view illustrating a layout of an ESD circuit and an associated address pad in accordance of a first embodiment of the present invention.

FIG. 2 shows the layout of an address pad in accordance with a first embodiment of the present invention. In FIG. 2, in order to reduce the area occupied by the ESD protection transistors which are connected to address pads 9 and 10, respectively, the ESD protection transistors 1 and 2 are formed with N-type active areas S5 and S6 serving as source areas and active guard lines 13 and 14 in common. Gates and sources of the aforesaid ESD protection transistors 1 and 2 are connected to a ground potential VSS and drains thereof are connected to the address pads 9 and 10. The P-type active guard line 13 for preventing latch-up is formed on the periphery of the ESD protection transistors 1 and 2 which are jointly connected by the N-type active areas S5 and S6. The P-type active guard line 13 is then shielded by the N-type active guard line 14. Consequently, the area occupied by the ESD protection transistors in accordance with the layout as shown in FIG. 2 is less than the area of the conventional layout shown in FIG. 1.

The ESD protection transistor connected to the address pads 9 and 10 are formed as NMOS transistors in the embodiment of FIG. 2; they can, however, be embodied by PMOS transistors or other elements capable of achieving the equivalent effects.

Figure 3:
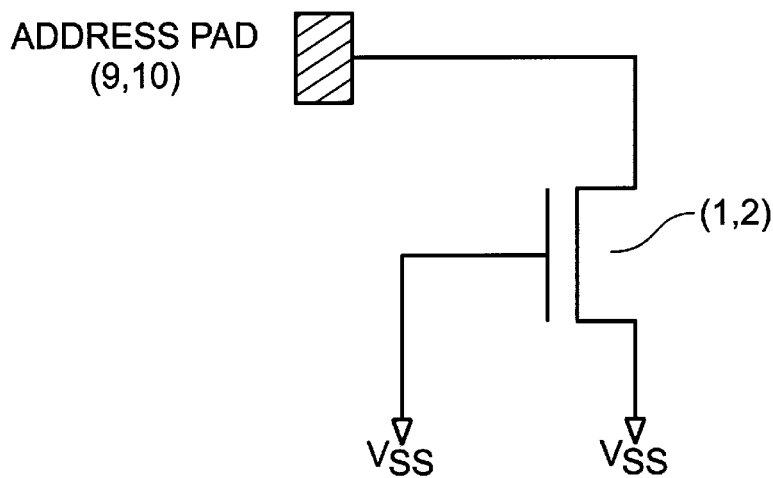
FIG. 3 is a circuit diagram of a portion of the structure shown in FIG. 2.

Referring to FIG. 3, which is a circuit diagram of the ESD protection transistors connected to the address pads, gates and sources of the ESD protection transistors 1 and 2 are connected to the ground potential VSS, and drains thereof are respectively connected to the address pads 9 and 10.

Figure 4A:
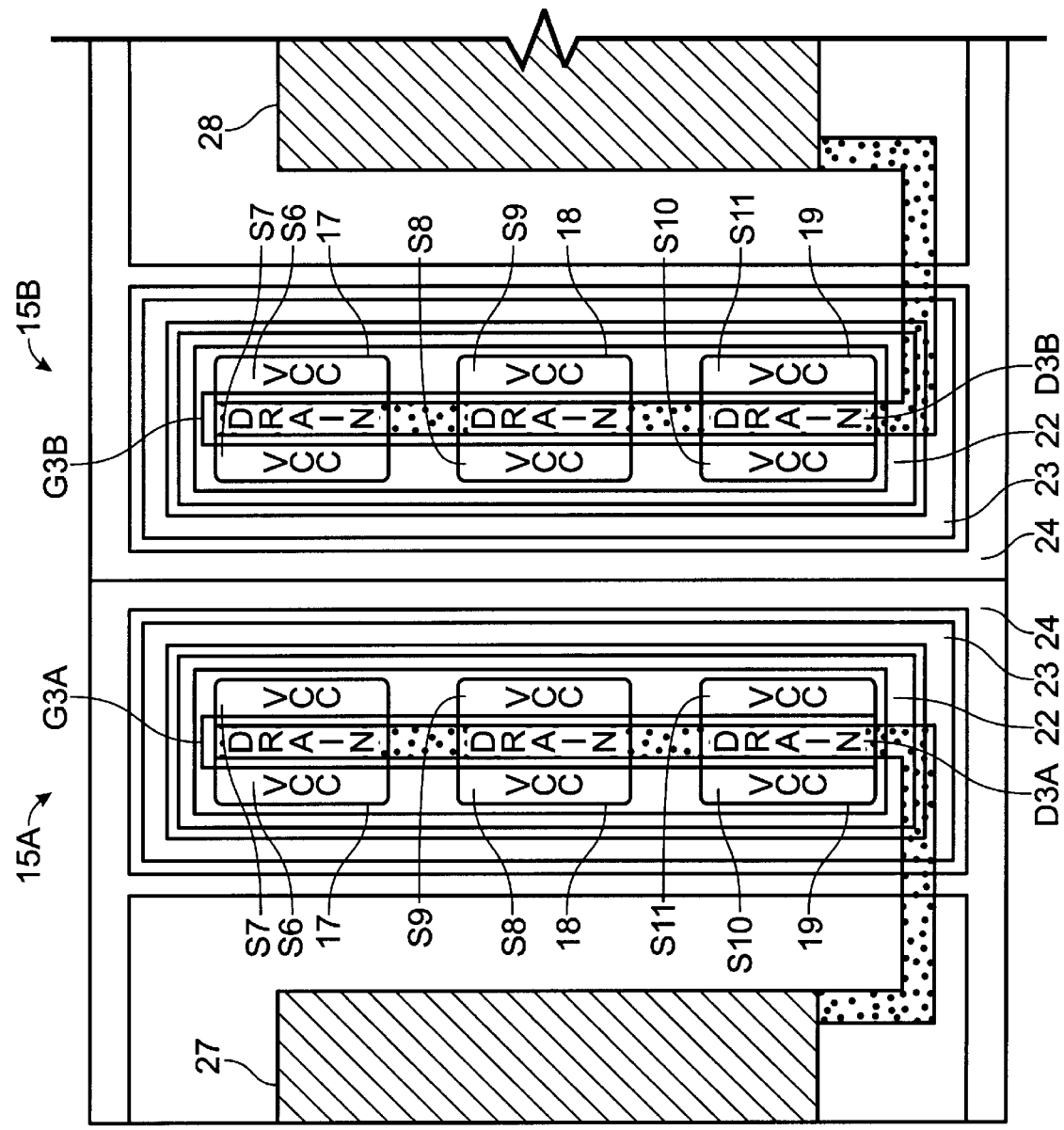
FIG. 4 is a view illustrating a layout of a prior art ESD circuit and associated input/output pad, utilizing a pull-up P-type transistor.
Figure 4B:
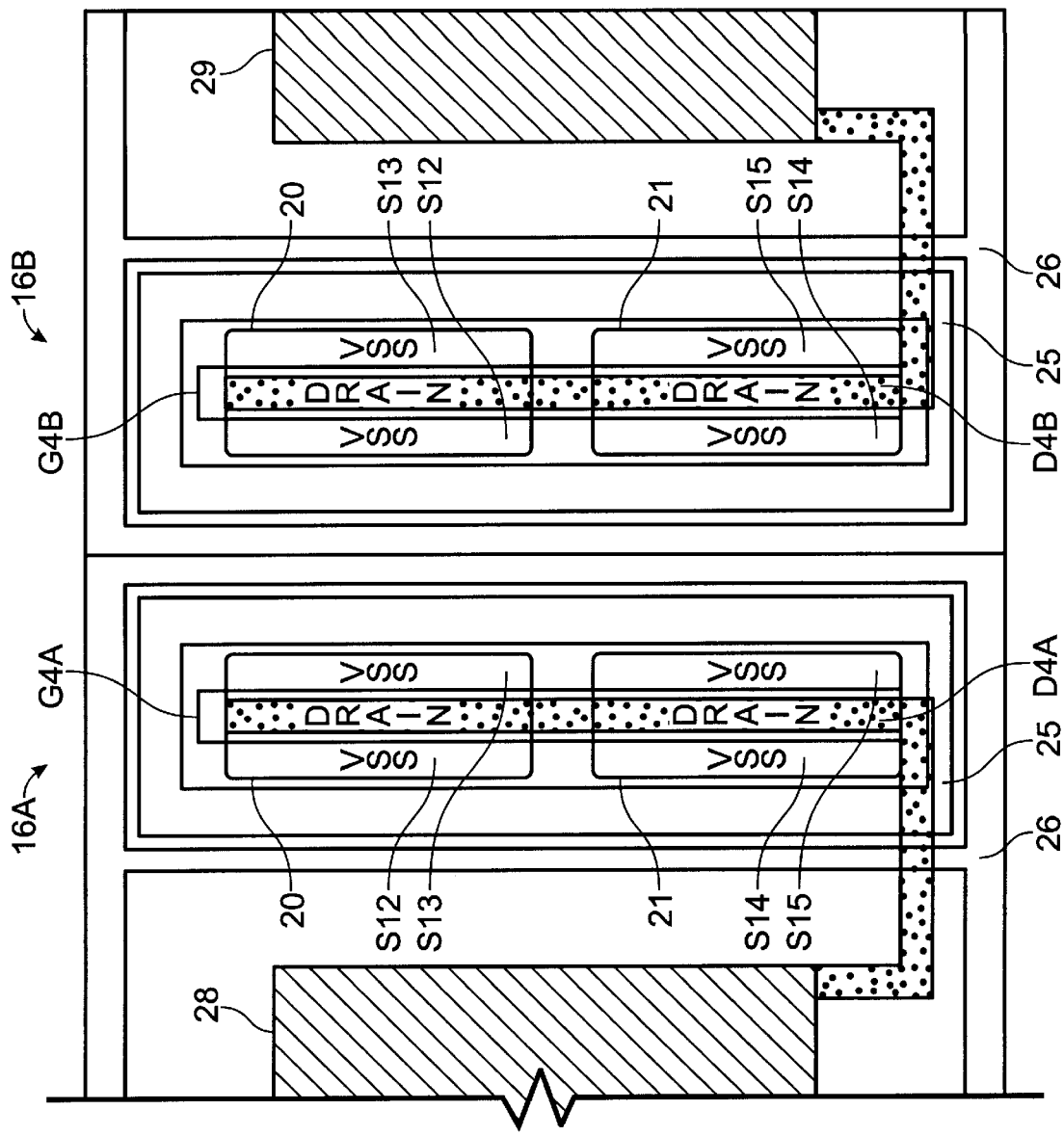

FIG. 4 shows a pull-up P-type transistor and a pull-down N-type transistor connected to conventional I/O pads. In FIG. 4, a PMOS pull-up transistor 15 and NMOS pull-down transistor 16 are respectively connected to I/O pads 27, 28 and 29. The PMOS transistor 15 is formed by dividing three active areas 17, 18, and 19, and the NMOS transistor 16 is formed by dividing two active areas 20 and 21. Further, the source areas S6 to S11 are formed in the active areas 17, 18 and 19, and the drain area D3 is formed between the source areas S6 and S7, between S8 and S9, and between S 10 and S11, respectively. A gate G3A (G3B) is formed on the channel area formed between the drain area D3 and the source areas S6 to S11.

The source areas S12 to S15 are formed in the active areas 20 and 21 which forms the NMOS transistor 16, and the drain area D4 is formed between the source areas S12 and S13 and between S14 and S15. The gate G4 is formed on the channel area formed between the drain area D4 and the source areas S12 and S13 and between S14 and S15.

PMOS transistor 15 and NMOS transistor 16 may be transistors serving as input/output drivers. Transistors 15, 16 are connected to I/O pad 28 via drains D3B and D4A, respectively. An N-type active guard line 22 for preventing latch-up is formed on the periphery of PMOS transistor 15. A P-type active guard line 23 is formed to shield the N-type active guard line 22. P-type active guard line 25 is formed on the periphery of the NMOS transistor 16, and the N-type active guard line 26 is then formed to shield the P-type active guard line 25.

Figure 5:
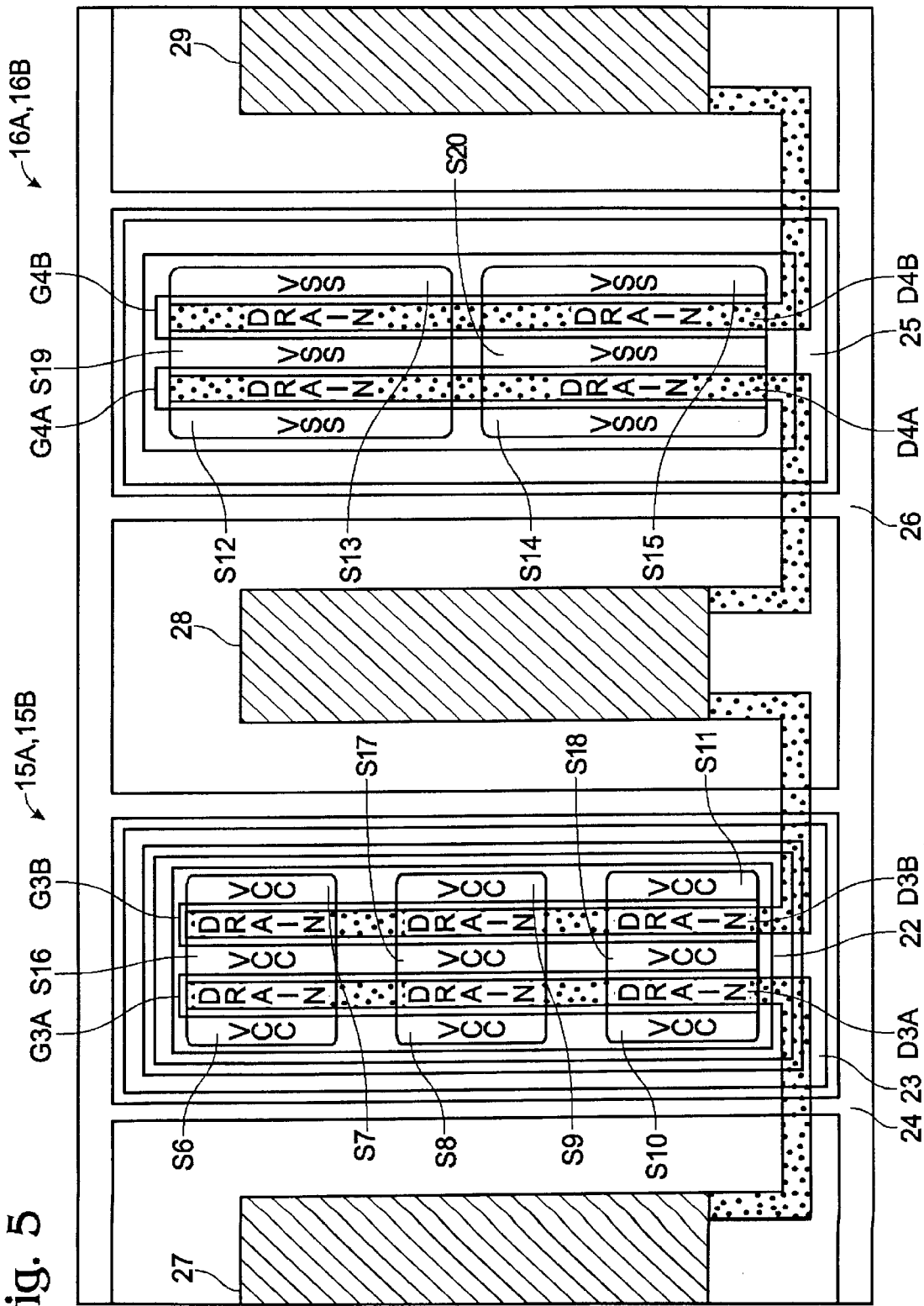
FIG. 5 is a view illustrating a layout of an ESD circuit incorporating a pull-up P-type transistor and an associated input/output pad in accordance with a second embodiment of the present invention.

FIG. 5 shows the layout of the I/O pad in which pull-up P-type transistor 15 and pull-down N-type transistor 16 are arranged in accordance with a second embodiment of the present invention. In FIG. 5, in order to reduce the area occupied by the transistors between I/O pads 27, 28, and 29, sources of transistors 15A and 15B connected between adjacent I/O pads 27 and 28 shown in FIG. 4 are jointly served as the identical active areas S16 to S18 in FIG. 5. The sources of the NMOS transistors 16A and 16B connected between I/O pads 28 and 29 are jointly served as the identical active areas S19 and S20. The sources of PMOS transistors 15A and 15B are connected to the supply voltage VCC and the drains thereof are connected to the address pads 27 and 28 as shown. An N-type active guard line 22 for preventing latch up is formed on the periphery of the PMOS transistors 15A and 15B which are jointly connected by the active areas S16 to S18. A P-type active guard line 23 is formed to shield the N-type active guard line 22 and an N-type active guard line 24 is then formed to shield the P-type active guard line 23. Thus, the area of the I/O pad layout as explained above is reduced compared with that of the conventional I/O pad layout due to the common active areas S16, S17, and S18 and due to the common guard lines 22,23, 24. In the same manner as the PMOS transistors 15A and 15B described previously, the NMOS transistors 16A and 16B hold the active areas S19 and S10 and the active guard lines 25 and 26 in common, thereby reducing chip area.

Figure 6:
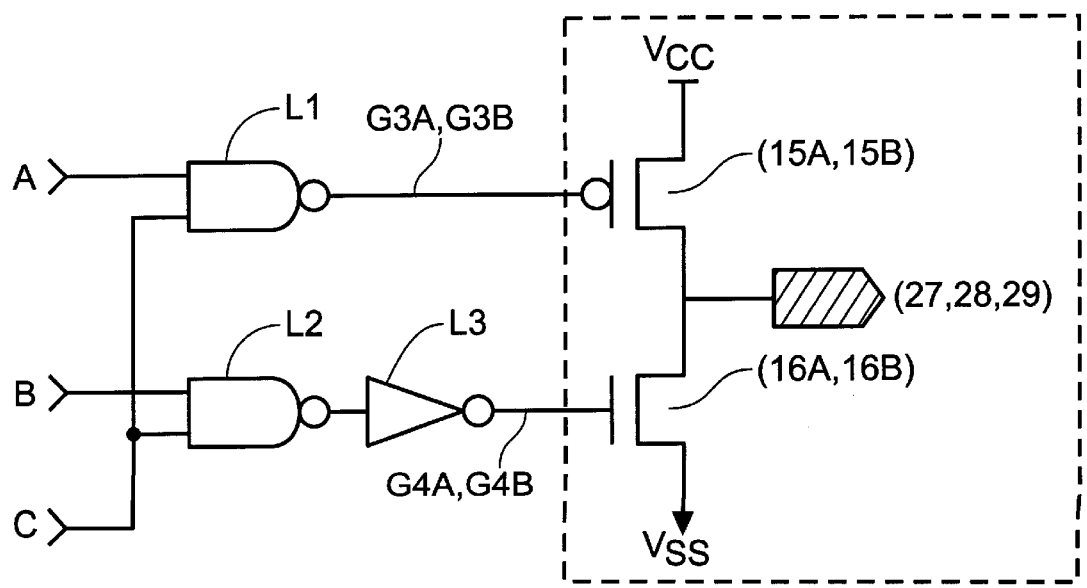
FIG. 6 is a circuit diagram of a portion of the structure shown in FIG. 5.

FIG. 6 is an equivalent circuit diagram with respect to FIG. 5. The sources of the PMOS transistors 15A and 15B are connected to the supply voltage, and the gates thereof are connected to an output terminal of a NAND gate L1. The drains thereof are connected to the pads 27, 28. Similarly, the sources of the NMOS transistors are connected to the ground potential, the gates thereof are connected to an output terminal of an inventor L3, and the drains thereof are connected to the pads 28 and 29.

A first input terminal A of the NAND gate L1 receives a first data output, and a second input terminal C receives a signal for driving the NAND gate L1. A first input terminal B of the NAND L2 receives a second data output, and a second input terminal C thereof is shared by the first NAND gate L1. The output terminal of the second NAND gate L2 is connected to an input terminal of the invertor L3. These logic gates serve as a control circuit for driving the transistors 15 and 16.

Figure 7A:
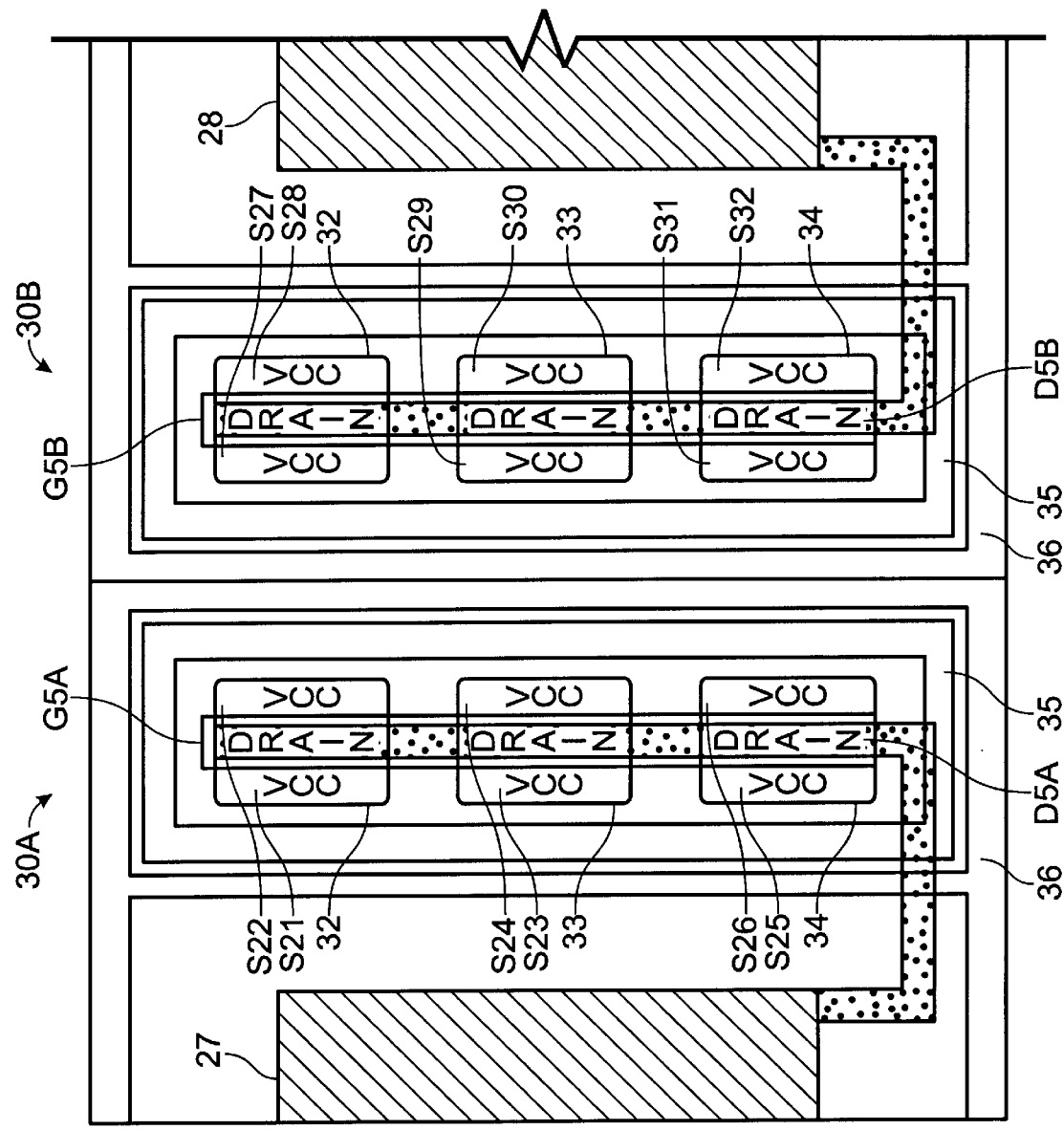
FIG. 7 is a view illustrating a layout of a prior art ESD circuit incorporating a pull-up N-type transistor and an associated input/output pad.
Figure 7B:
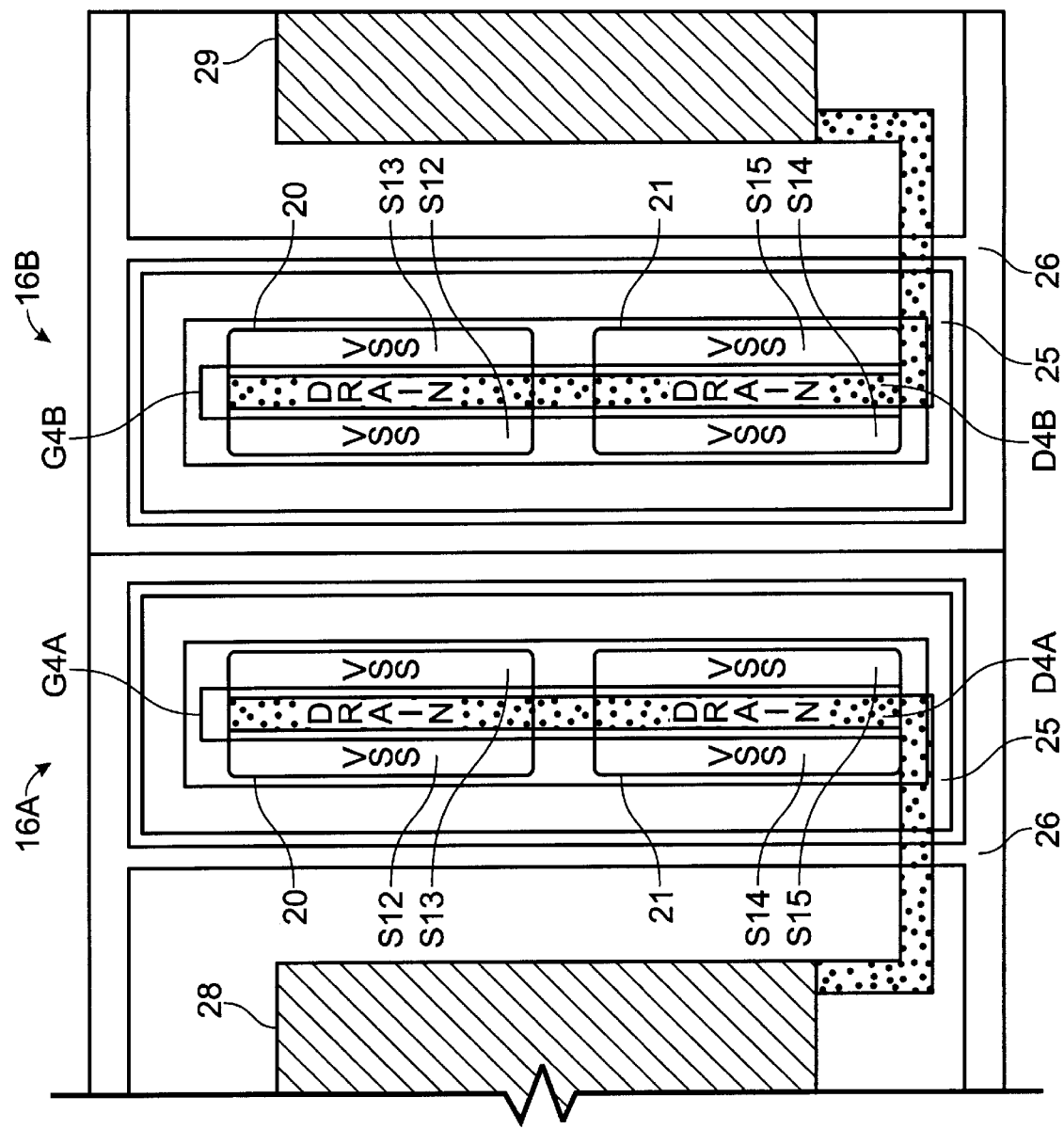

FIG. 7 shows a layout in which PMOS pull-up transistors 15 as shown in FIG. 4 are modified to NMOS pull-up transistors 30.

Referring to FIG. 7, NMOS transistors 30 are connected to I/O pads 27 and 28 and have active areas 32 to 34. In the embodiment of FIG. 7, transistors 30 serve as data input/output drivers. Source areas S21 to S26 are formed in the active areas 32 and 34. Drain area D5A is formed between the source areas S21 and S22, between the source areas S23 and S24 and between the source areas S25 and S26, respectively. A gate G5A is formed on the channel area between the drain area D5A and the source areas S21 and S26. The NMOS transistors 30 serve as electrostatic discharge protection transistors. In addition, in order to prevent latch-up, a P-type active guard line 35 is formed on the periphery of each NMOS transistor 30 and an N-type active guard line 36 is formed to shield the P-type active guard line 35.

Each of the NMOS pull-down transistors 16 has the same configuration as that in FIG. 4.

Figure 8:
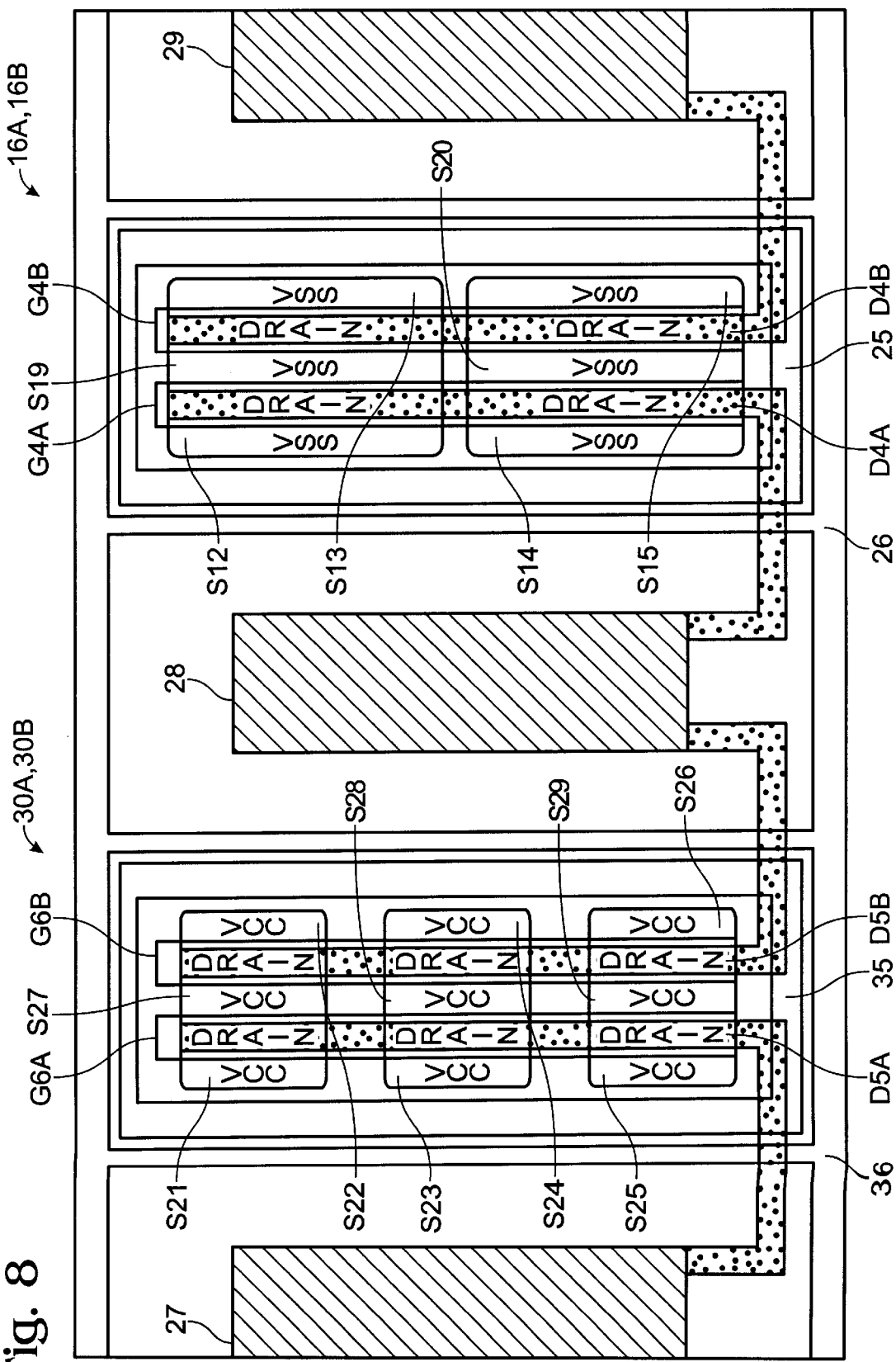
FIG. 8 is a view illustrating a layout of an ESD circuit incorporating a pull-up N-type transistor and an associated input/output pad in accordance with a third embodiment of the present invention.

With regard to FIG. 8, the configuration of the NMOS transistor 16 serving as the pull-down transistor is the same as that of the NMOS transistor shown in FIG. 5 and the configuration of the NMOS transistor 30 serving as the pull-up transistor is the same as that of the PMOS transistor 15 in FIG. 5. In other words, the sources of the NMOS transistors 30A and 30B jointly serve as the active area S27 to S29. The sources of the NMOS transistor 30A and 30B are connected to the supply voltage VCC and the drains thereof are connected to the address pads 27 and 28. Further, P-type active guard line 35, for preventing latch-up, is formed on the periphery of the NMOS transistors 30A and 30B, which are jointly connected by the active areas S27 to S29. N-type active guard line 36 is formed to shield the P+ active guard line 35. Thus, the area of the I/O pad layout as stated above is reduced in comparison with the area of the conventional I/O pad layout.

Figure 9:
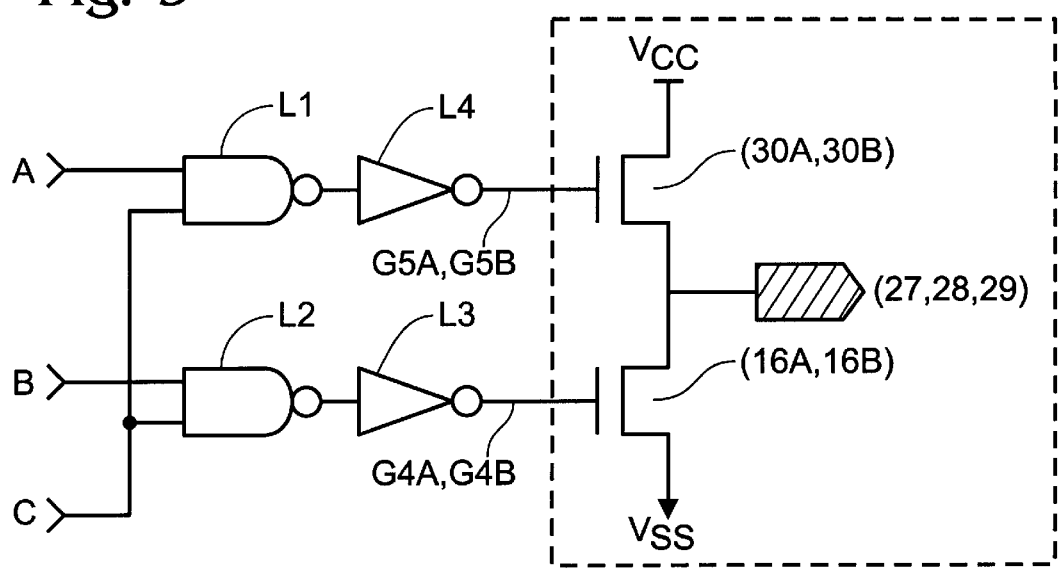
FIG. 9 is a circuit diagram of a portion of the structure shown in FIG. 8.

Referring to FIG. 9, which is a diagram of FIG. 8, the configuration of the pull-up and pull-down transistors 30 and 16, respectively, is the same as that of the pull-down/up transistors as explained in FIG. 6. However, since the pull-up transistor 30 comprises the NMOS transistors, an invertor L4 is added between the output terminal of the NAND gate L1 and the gate of the pull-up transistor 30, thereby controlling the pull-up and pull-down transistors 30 and 16.

Figure 10:
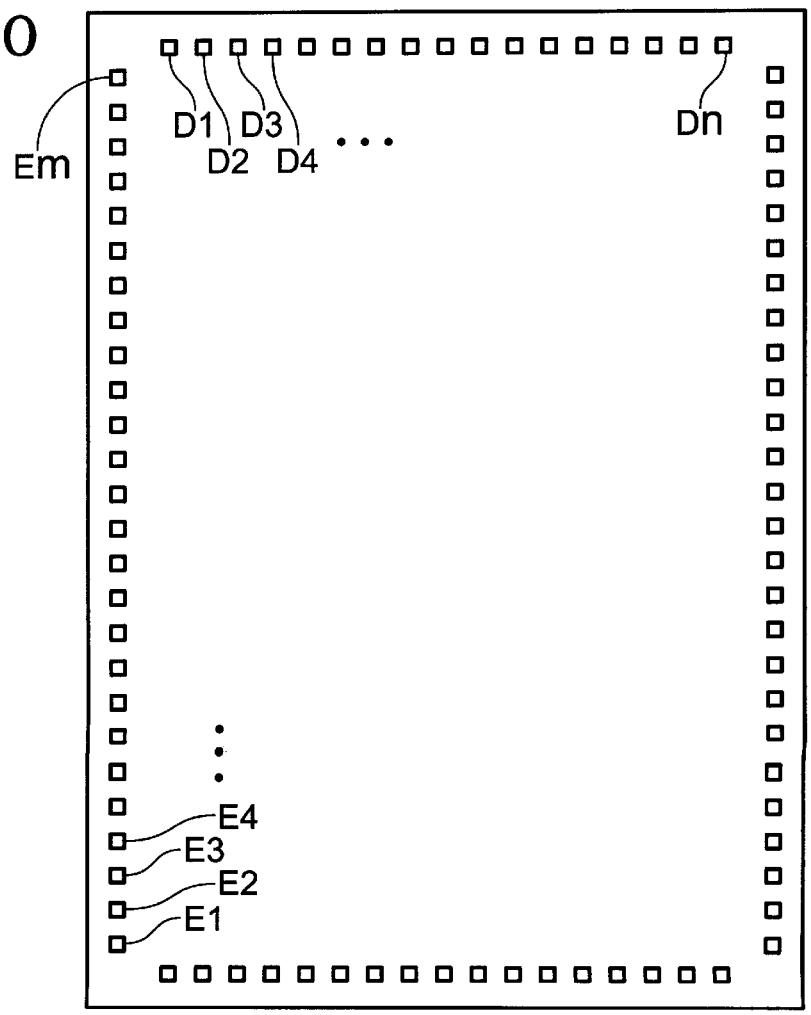
FIG. 10 is a diagram of a semiconductor chip constructed in accordance with the principles of the present invention.

FIG. 10 shows a diagram of a semiconductor chip constructed according to the principles of the present invention including address pads D1, D2, D3, D4, . . . DN and the I/O pads E1, E2, E3, E4, . . . En, including address pads 9 and 10 and I/O pads 27, 28, and 29, respectively.

In the layout of the semiconductor memory device with the ESD protection transistors between adjacent pads in accordance with the principles of the present invention, the increase of the die size caused by the increase of the number of pins can be prevented, Furthermore, it is advantageous that this layout can be flexibly applied during the semiconductor chip manufacturing process.

We claim:

1. A device located between adjacent signal pads of a semiconductor memory circuit having a plurality of pads for receiving signals comprising:
    a first conductivity type semiconductor substrate;
    a first transistor comprising:
        a first pair of second conductivity type semiconductor regions formed in said substrate;
        a second conductivity type semiconductor region formed between the regions in said pair and connected to a first one of such pads; and
        a first gate arranged and formed over a channel area located between the regions in said first pair;
    a second transistor comprising:
        a second pair of second conductivity type semiconductor regions formed in said substrate;
        a second conductivity type semiconductor region formed between the regions in said second pair and connected to a second one of such pads; and
        a second gate arranged and formed over a channel area between the regions in said second pair;
    wherein one of the active regions in the first pair of second conductivity type semiconductor regions and one of the active regions in the second pair of second conductivity type semiconductor regions comprise one and the same active region; and
    a first guard region comprised of said first conductivity type semiconductor region formed in said substrate and surrounding said first and second transistors, the first guard region having a heavier doping level than the substrate.

2. The circuit of claim 1 wherein said circuit further comprises a second guard region comprised of said second conductivity type semiconductor region shielding the first guard region, said second guard region being formed in said substrate and surrounding the first guard region.

3. The circuit of claim 2 wherein said second guard region comprises an N-type active guard line and said first guard region comprises a P-type active guard line.

4. The circuit of claim 1 wherein said first and second transistors comprise N-type MOS transistors.

5. The circuit of claim 4 wherein said one and the same active region comprises a common source.

6. The device of claim 1 wherein each region in said first and second pairs of the second conductivity type semiconductor regions are connected to a first predetermined substantially constant potential.

7. The device of claim 6 wherein said device comprises an electrostatic discharge protection device and wherein said first and second gates are each connected to said first predetermined substantially constant potential.

8. The device of claim 7 wherein said first substantially constant potential comprises a ground potential of a power supply for said semiconductor memory circuit.

9. The device of claim 6 wherein said device comprises an output driver and wherein said first and second gates are each connected to a first and second output signals generated by said semiconductor memory circuit.

10. The device of claim 9 wherein said device includes a third pad adjacent said second pad, the first, second, and third pads for inputting and outputting data signals, the first and second transistors for driving the first, second, and third pads, and wherein said device further comprises:
    a third transistor located between said second and third pads for driving the first, second, and third pads, comprising:
        a third pair of second conductivity type semiconductor regions formed in said substrate;
        a second conductivity type semiconductor region formed between the regions in said third pair and connected to said second pad; and
        a third gate arranged and formed over a channel area between the regions in said third pair and connected to a third output signal data generated by said semiconductor memory circuit;
    a fourth transistor located between said second and third pads for driving the second and third pads, comprising:
        a fourth pair of second conductivity type semiconductor regions formed in said substrate;
        a second conductivity type semiconductor region formed between the regions in said fourth pair and connected to said third pad; and
        a fourth gate arranged and formed over a channel area between the regions in said fourth pair and connected to a fourth output signal data generated by said semiconductor memory circuit;
    wherein one of the active regions in the third pair of second conductivity type semiconductor regions and one of the active regions in the fourth pair of conductivity type semiconductor regions comprise one and the same active region; and
    a third guard region comprised of said first conductivity type semiconductor region formed in said substrate and surrounding said third and fourth transistors.

11. The device of claim 10 wherein each region in said third and fourth pairs of said second conductivity type semiconductor regions are connected to a second predetermined substantially constant potential.

12. The device of claim 11 wherein said first and second substantially constant potentials comprise first and second potentials, respectively, generated by a power supply for said semiconductor memory circuit.

* * * * *

UNITED STATES PATENT AND TRADEMARK OFFICE
CERTIFICATE OF CORRECTION

PATENT NO. : 5,962,899
DATED : October 5, 1999
INVENTOR(S) : Yang et al.

It is certified that error appears in the above-identified patent and that said Letters Patent is hereby corrected as shown below:

Column 1,
Line 56, "lines 5, 8" should read -- lines 5, 7 --.
Line 59, "pads 9, 6" should read -- pads 9, 10 --.

Column 3,
Line 46, "Transistors 15, 16" should read -- Transistors 15B, 16A --.

Column 4,
Line 13, "S19 and S10" should read -- S19 and S20 --.

Signed and Sealed this

Twenty-sixth Day of November, 2002

*Attest:*

JAMES E. ROGAN
*Attesting Officer*     *Director of the United States Patent and Trademark Office*